United States Patent [19]
Mehrgardt et al.

[11] Patent Number: 5,406,202
[45] Date of Patent: Apr. 11, 1995

[54] OFFSET-COMPENSATED HALL SENSOR HAVING PLURAL HALL DETECTORS HAVING DIFFERENT GEOMETRICAL ORIENTATIONS AND HAVING SWITCHABLE DIRECTIONS

[75] Inventors: Soenke Mehrgardt, March-Meuershausen; Lothar Blossfeld, Freiburg-Hochdorf, both of Germany

[73] Assignee: Deutsche ITT Industries GmbH, Freiburg, Germany

[21] Appl. No.: 987,918

[22] Filed: Dec. 8, 1992

[30] Foreign Application Priority Data

Dec. 21, 1991 [EP] European Pat. Off. ........... 91122046

[51] Int. Cl.⁶ .................................................. G01R 33/06
[52] U.S. Cl. .................................... 324/251; 324/225; 327/511
[58] Field of Search ................. 324/207.12, 207.20, 324/225, 235, 251; 307/309; 73/DIG. 3

[56] References Cited

U.S. PATENT DOCUMENTS

| | | | |
|---|---|---|---|
| 3,162,805 | 12/1964 | Robertson | 324/207.2 X |
| 3,886,446 | 5/1975 | Laranov et al. | 324/251 |
| 4,037,150 | 7/1977 | Taranov et al. | 324/251 |
| 4,668,914 | 5/1987 | Kersten et al. | 324/251 |
| 4,875,008 | 10/1989 | Lorenzen | 324/251 |

FOREIGN PATENT DOCUMENTS 1194971 6/1965 Germany.
2333080 1/1975 Germany.

OTHER PUBLICATIONS

Gian S. Randhawa, "Monolithic integrated Hall devices in silicon circuits," *Microelectronics Journal*, vol. 12, No. 6, Nov./Dec. 1981, pp. 24≧29.

John R. Hines, et al., "New Life for Hall Effect Sensors," *Machine Design*, vol. 57, No. 23, Oct. 10, 1985, pp. 83–87.

P. J. A. Munter, "Electronic Circuitry for a Smart Spinning-current Hall Plate with Low Offset," *Sensors And Actuators A*, vol. 27, No. 1-3, May 15, 1991, pp. 747–751 (from *Proceedings of Eurosensors IV*, Karlsruhe, Germany, Oct. 1-3, 1990).

*Primary Examiner*—Gerard R. Strecker
*Attorney, Agent, or Firm*—Thomas L. Peterson

[57] ABSTRACT

For improved offset compensation, a Hall sensor is provided with a device for orthogonally switching the Hall detector supply current and the Hall-voltage taps. A summing device determines an offset-compensated Hall-voltage value from first and second predetermined Hall-voltage values. The Hall-voltage values are formed by means of a Hall detector containing at least first and second Hall cells for offset-voltage precompensation. The first and second Hall cells are identical and are orthogonally switchable. The geometrical orientation of the first and second Hall cells includes an angle other than 0° and 180°.

20 Claims, 2 Drawing Sheets

OFFSET-COMPENSATED HALL SENSOR HAVING PLURAL HALL DETECTORS HAVING DIFFERENT GEOMETRICAL ORIENTATIONS AND HAVING SWITCHABLE DIRECTIONS

BACKGROUND OF THE INVENTION

1. Field of the Invention

The present invention relates to a Hall sensor for measuring magnetic fields, particularly to a Hall sensor in the form of a monolithic integrated component containing a Hall detector, a power supply, and electronic circuits for evaluating the Hall voltage.

2. Description of the Related Art

To fabricate a Hall sensor comprising a combined detector, power supply and electronics circuit, use is commonly made of one of the conventional silicon semiconductor technologies which correspond to the conventional bipolar or MOS fabrication processes. Known disadvantages of silicon as the Hall detector material are its low Hall sensitivity and the great influence of the piezoelectric effect, which leads to offset-voltage errors caused by stresses in the crystal structure and caused by direction-dependent Hall sensitivity.

The sensitivity of Hall detectors is essentially a function of the carrier mobility and the current flow through the Hall plate. The resolution limit and the spread of measured values are dependent mainly on the variation of the different offset voltages, which depend on the Hall detector itself and the subsequent electronics.

A Hall plate can, to a first approximation, be thought of as a resistance bridge which is adjusted for zero output, i.e., balanced, if no magnetic field is present. Methods for fabricating Hall sensors in which the desired accuracy can only be achieved by a selection from the wide fabrication spectrum are quite unsatisfactory, of course. Therefore, tolerances are kept to a minimum during fabrication by compensation methods. The most widely used method is the compensation of the Hall plate offset voltage by parallel connection of a second Hall plate rotated by 90° which is as equivalent to the first Hall plate as possible. This makes it possible to compensate, to a first approximation, for the imbalance of the resistance bridge due to the piezoelectric effect. Nevertheless, process tolerances or high stress gradients in the crystal prevent a higher precision of the magnetic-field measurement.

A method of compensating the offset voltages is described in "Proceedings of Eurosensors IV", 1991, Vol. 2, pages 747 to 751, which relates to a meeting held in Karlsruhe October 1-3, 1990. The method described therein uses a circular Hall plate with 16 contacts uniformly distributed around the periphery, which are switched circularly by means of electronic switches. The 16 associated Hall voltages are integrated causing the offset error to be reduced to values less than 50 microvolts. In the pertinent description it is stated that it is possible to completely eliminate geometrical errors of the Hall plate by orthogonal switching, but not to eliminate offset errors due to the above-described piezoelectric effects.

Since offset errors in silicon are frequently considerably greater—for instance, up to a factor of 1000—than the Hall voltage to be determined, there is also a specific error of the evaluating circuit.

Assuming an ideal equivalent bridge circuit, during orthogonal switching, the offset error occurs with different signs. If the two orthogonal Hall voltages were summed, the offset error would thus have to be fully compensated. This would apply only if strict proportionality, linearity, equal gain and sensitivity can be assumed for the amplified and processed Hall voltages. The linearity and sensitivity requirements are generally insufficient.

SUMMARY OF THE INVENTION

It is, therefore, an object of the invention as claimed to provide a Hall sensor having improved offset-voltage compensation. As a further object, the Hall sensor is to be producible together with the evaluation electronics as a monolithic integrated component using a conventional semiconductor technology.

BRIEF DESCRIPTION OF THE DRAWINGS

The invention and its advantages will now be explained in greater detail with reference to the accompanying drawings in which.

DETAILED DESCRIPTION OF THE INVENTION

The Hall voltage Vh of a Hall cell may be determined by:

$$Vh = Rsq \times Ihall \times \mu h \times Bz + Voffset,$$

where Rsq is the sheet resistivity of the Hall plate, $\mu h$ is the Hall mobility, and Bz is the magnetic field strength perpendicular to the Hall plate.

Figure 6:
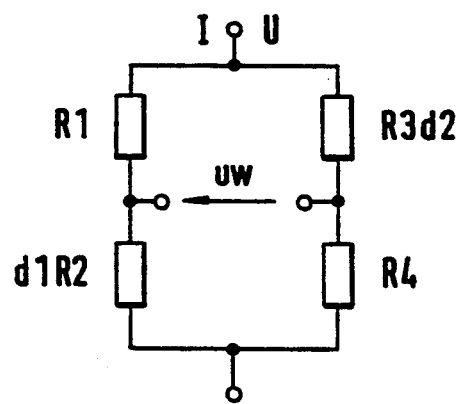
FIG. 6 shows the equivalent bridge circuit of a single Hall cell.

Assuming an equivalent bridge circuit as shown in FIG. 6, in the worst case, the stresses in the crystal cause the values of the resistors R2 and R3 to change by the factors d1 and d2, respectively (i.e., the value of R2 becomes d1R2 and the value of R3 becomes d2R3. When the bridge is switched by 90°, or when an identical, but orthogonally controlled, second bridge is connected in parallel therewith, the imbalance factors d1, d2 will cancel out completely.

Unfortunately, this ideal bridge model cannot be fully applied to a Hall plate with offset. If, for offset compensation, a second Hall plate rotated by 90° is connected in parallel with the first Hall plate as usual, an offset voltage of reverse polarity will be generated in the second plate, but complete compensation will not be achieved by the parallel connection or by summation of the two Hall voltages since the stress conditions in the second Hall plate are different from those in the first plate. According to the invention, however, the second Hall plate is used only for offset—error precompensation —the compensation proper is accomplished by the orthogonal switching and the summation of the Hall voltages measured during the switching. The precompensation according to the invention has an added advantage that the two Hall plates need not be oriented at 90° to each other, but the angle can be arbitrary between 0° and 180°. Thus, angles can be chosen which are particularly stress-sensitive because of the crystal lattice.

Figure 1:
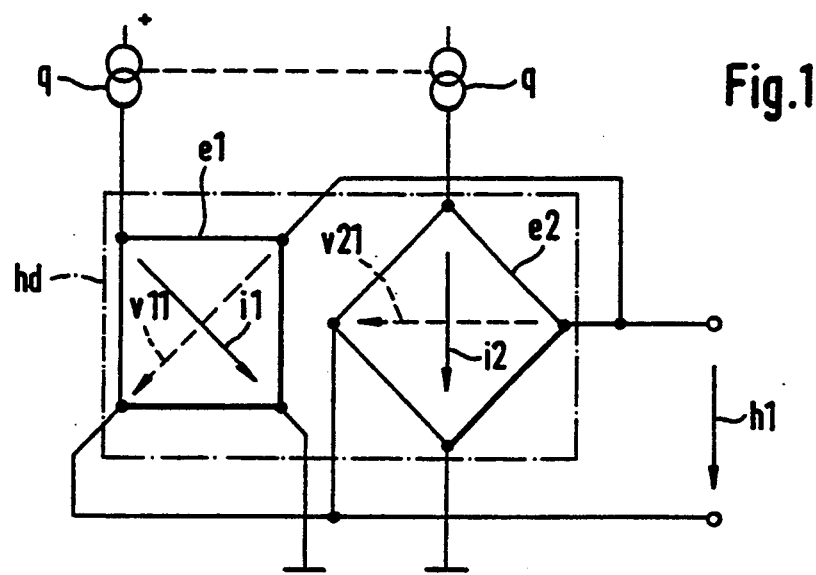
FIG. 1 shows schematically a precompensated Hall detector in the first orthogonal position.

In FIG. 1, a first Hall cell e1 and an adjacent second Hall cell e2 are interconnected to form a Hall detector hd. The orientation follows from the orientation of the first and second Hall cell supply currents i1 and i2, respectively. Thus, in FIG. 1, the two Hall cells are at 45° to each other. The current is fed into the Hall cell diagonally at the corner points, so that the two other corner points serve as Hall-voltage taps. Each Hall cell is fed from a current source q of its own. The Hall-voltage taps are connected in parallel, and supply to the output terminals a first Hall-voltage value h1 as a parallel switching value.

Figure 2:
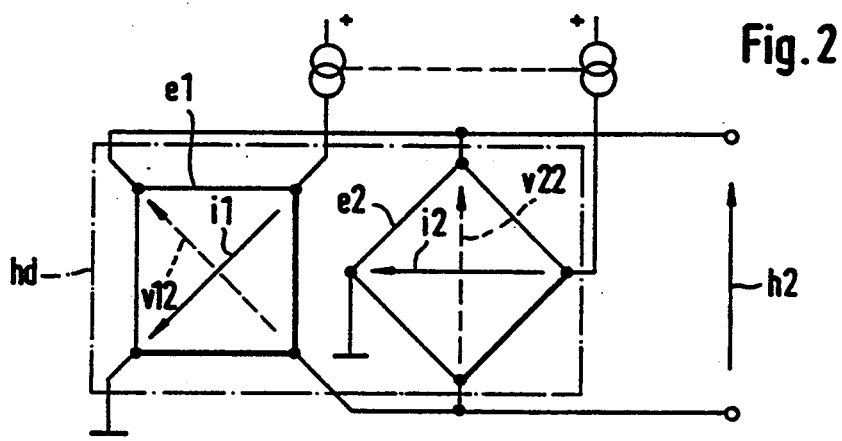
FIG. 2 shows the precompensated hall detector in the second orthogonal position.

FIG. 2 shows the same Hall-detector arrangement as FIG. 1, but in the second orthogonal position. Consequently, in the two Hall cells e1, e2, the respective direction of the Hall cell supply current i1, i2 is switched by 90°. Accordingly, the Hall-voltage taps are also switched by 90°. The output terminals provide a second Hall-voltage value h2 as a parallel switching value. For simplicity, in FIGS. 1 and 2, the respective parallel-connected Hall-voltage taps are interconnected at a node. In the actual implementation, this must not be a fixed node, since different Hall-voltage taps must be interconnected in the first and second orthogonal positions. The interconnection is therefore made by electronic switches in a switch stage mx, as shown, for example, in FIG. 3.

Figure 3:
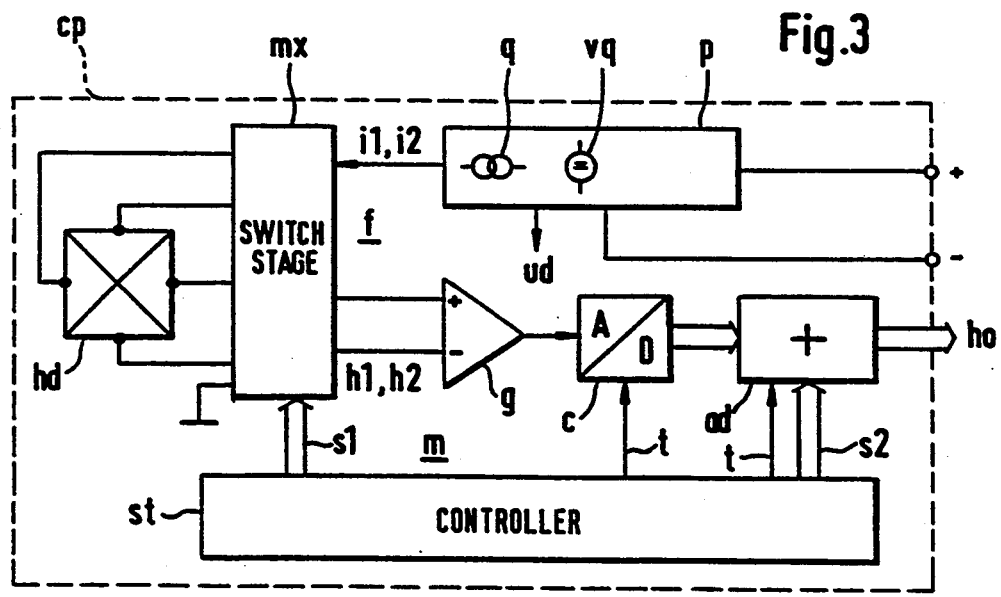
FIG. 3 shows schematically the essential subcircuits of a monolithic integrated Hall sensor.

FIG. 3 shows schematically an embodiment of a Hall sensor as a monolithic integrated circuit on a semiconductor chip cp. The necessary devices f and subcircuits for orthogonally switching the Hall detector supply current and the Hall-voltage taps as well as the evaluating device m and summing device ad, which are required to further process the measured Hall voltages, are integrated on the same chip. The magnetic-field-measuring device proper is the orthogonally switchable Hall detector hd, whose leads are connected to an electronic switch stage mx. A controller st and control signals s1 are used to determine through which terminals the supply currents are injected or drawn off and from which terminals the Hall voltages are to be tapped. Current is supplied to the Hall cells through a supply device p, which is fed with an external unregulated supply voltage and which delivers the constant Hall cell supply currents i1, i2 through controlled current sources q. The supply device p further includes a voltage regulator vq, which delivers the internal supply voltage ud for the entire chip.

The Hall voltages tapped at the individual Hall cells in the Hall detector hd are connected in parallel in the switch stage mx and form the Hall-voltage values h1, h2, which are fed to a high-impedance amplifier g. The output of the amplifier g, which forms part of the Hall-voltage-evaluating device m, is connected to the input of an analog-to-digital converter c, which digitizes the applied signals and feeds its output to a digital adder ad. The latter adds the first and second digitized Hall-voltage values h1, h2 and provides the sum signal as an offset-compensated Hall voltage value ho. The adder ad is controlled by a second control signal s2 from the controller st. The control signal s2 resets the accumulator of the adder ad, for example, before a new measurement cycle begins.

Normally, each cycle only includes the summation of the measured values of the first and second orthogonal positions. A summation may also be performed over four successive orthogonal positions, of course; this corresponds to one full circulation of the Hall cell supply currents in the Hall detector hd. The controller st further provides clock signals t for synchronizing the digitization, summation, and data output.

The basic shape of the Hall cells, because of the geometric equality necessary during orthogonal switching, requires rotational symmetry. This is satisfied by the usual square basic shape of the Hall cells. However, during quadrature switching, the usual current injection along one side of the square poses the problem that the Hall-voltage taps collide with the current contacts at the side. This conflict is avoided if the current is injected into or taken from the square Hall cells at the diagonally opposite corner points. At the two other corner points, the Hall voltage can be tapped. If quadrature switching is used, the current and voltage contacts will simply be interchanged.

Figure 4:
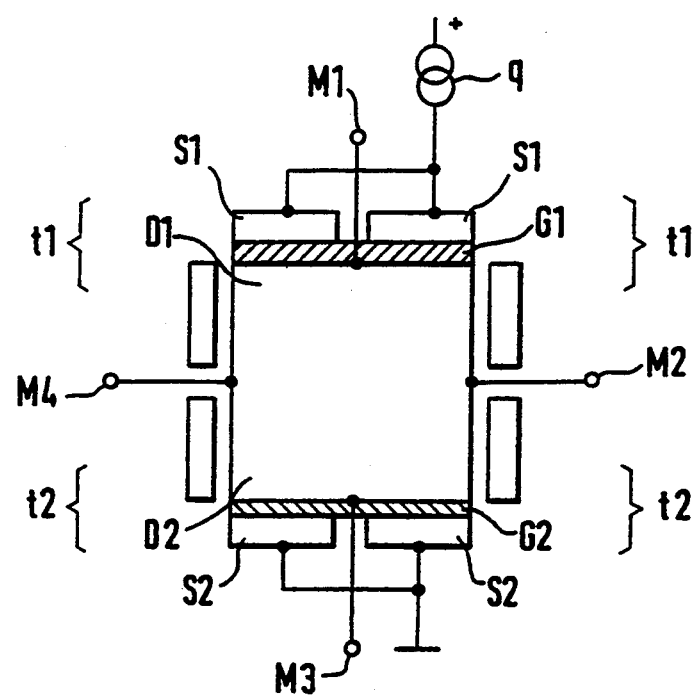
FIG. 4 shows schematically a Hall cell whose power supply is separated from the measuring contacts.

FIG. 4 shows schematically a square Hall cell which permits orthogonal switching although the direction of current flow is parallel to the sides of the square. At the midpoint of each of the sides, the Hall-voltage-measuring contacts M1, M2, M3, M4 are provided. However, the currents are applied to and taken from the Hall cell contactlessly via MOS transistors. Along each side of the square, there are oblong regions of the same conductivity type as the Hall-cell region itself. Each of these oblong regions and the Hall-cell region forms an MOS transistor, with the gate and the underlying channel formed in the intermediate region. FIG. 4 shows, by way of example, a first MOS transistor t1 whose source electrode S1 is connected to the current source q, and whose drain electrode D1 is the Hall-cell region itself. The gate electrode G1 is brought into a conducting or nonconducting state by a control signal from the controller st. The current at the lower side of the Hall cell is shunted away through a second MOS transistor t2 whose source electrode S2 is connected to the ground terminal. The drain electrode D2 is formed by one side of the Hall-cell region, and the gate electrode G2 is located between these two regions.

Figure 5:
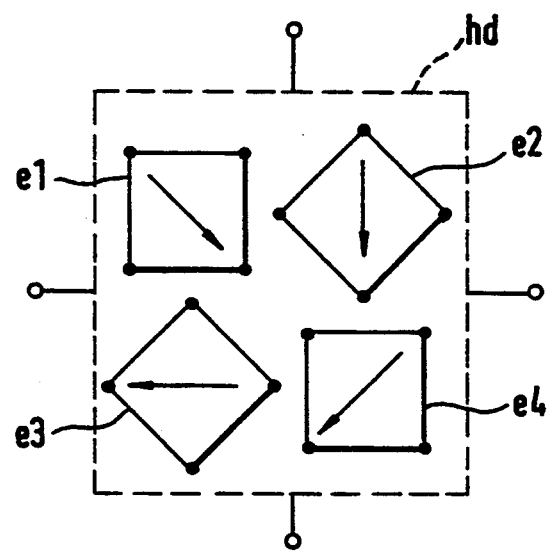
FIG. 5 shows an embodiment of a precompensated Hall detector with more than two Hall cells.

FIG. 5 shows schematically a Hall detector hd with four Hall cells e1 through e4. Through the parallel connection of these four hall cells, four different directions of the Hall cell supply current are used for precompensation. This, of course, gives an even better compensation for the direction-dependent piezoelectric effects. The associated switch stage must ensure that during orthogonal switching, the direction of each of the Hall cell supply currents is rotated by 90°.

FIG. 6 shows schematically the equivalent bridge circuit of a rotationally symmetrical Hall cell in which all resistance values are equal, i.e., R1=R2=R3=R4. The bridge is fed either with a constant voltage U or a constant current I. Any offset of the Hall cell due to a geometrical error or a stress factor is taken into account in the equivalent bridge circuit by the imbalance factors d1 and d2 of the second and third bridge resistors R2 and R3, respectively. The influence of the imbalance factors d1, d2 in the two orthogonal positions on the respective bridge voltage uw can be determined by mathematical transformations. In doing so, a distinction can be made between voltage and current injection.

If the bridge resistances do not change during orthogonal switching, the imbalance factors d1, d2 will cancel out completely during the summation of the two bridge voltages. However, as stated above, the bridge resistances R1 through R4 change due to the direction-dependent piezoelectric effect and the direction-dependent Hall sensitivity. If the Hall-cell resistance is dependent on current direction, current drive will be more favorable, because the current is maintained constant by a high-impedance constant-current source. In addition, a temperature-independent constant current generates a temperature-independent Hall voltage, as shown, for example, in applicant's European Patent Application 91 11 2840.3. The Hall cell supply current source described therein is coupled to the sheet resistivity Rsq of the Hall-cell region, since at a particular reference temperature To, the generated current is inversely proportional to the Hall cell sheet resistivity Rsq. As a result, the Hall-cell sensitivity is essentially independent of the fabrication parameters of the Hall-cell region.

The Hall-cell regions can be formed in various ways, namely from a relatively high-impedance region which is diffused or implanted, from an inversion layer formed or influenced with the aid of a gate electrode, or from individually deposited thin layers which are deposited by, for example, sputtering or chemical vapor deposition (CVD).

If the offset and linearity errors of the evaluating device are negligible, the individual Hall voltages v11, v21; v12, v22 can also be added directly in the summing device or adder ad. The precompensation, in which the Hall-voltage values h1, h2 are determined, is then only a computing step.

What is claimed is:

1. An offset-compensated Hall sensor for detecting a magnetic field, comprising:
   a Hall detector comprising a common substrate and at least a first Hall cell and a second Hall cell, said first and second Hall cells being technologically and geometrically equal, said first and second Hall cells further being thermally and spatially closely coupled on a common substrate, wherein:
   each of said first and second Hall cells has first and second pairs of terminals;
   each of said first and second Hall cells is orthogonally switchable such that a respective current flowing between any one of said respective pairs of terminals generates a respective Hall voltage in the other of said respective pairs, said respective Hall voltage responsive to said respective current flow and to a strength of said magnetic field perpendicular to said common substrate;
   said first and second Hall cells have a geometrical orientation with respect to each other determined by an angle between the respective current flows, wherein:
   said geometrical orientation has a first position wherein:
      said current flowing in said first Hall cell flows in a first direction between said first pair of terminals of said first Hall cell; and
      said current flowing in said second Hall cell flows in a second direction between said first pair of terminals of said second Hall cell, said second direction being at said angle to said first direction;
   and
   said geometrical orientation has a second position wherein:
      said current flowing in said first Hall cell flows in a third direction between said second pair of terminals of said first Hall cell, said third direction being orthogonal to said first direction; and
      said current flowing in said second Hall cell flows in a fourth direction between said second pairs of terminals of said second Hall cell, said fourth direction being orthogonal to said second direction;
   a source of first and second supply currents; a switching device connected to said source of first and second supply currents and to said first and second pairs of terminals of said first and second Hall cells, said switching device operating alternately to:
      switch first and second supply currents to said first pairs of terminals of said first and second Hall cells, respectively, to orient said Hall cells in said first position and to output a first Hall-voltage value from said second pairs of terminals of said first and second Hall cells when said first and second Hall cells are in said first position; and
      switch said first and second supply currents to said second pairs of terminals of said first and second Hall cells, respectively, to orient said Hall cells in said second position and to output a second Hall-voltage value from said first pairs of terminals of first and second Hall cells when said first and second Hall cells are in said second position; and
   a summing device that receives said first and second Hall-voltage values from said switching device, and that forms an offset-compensated Hall-voltage value.

2. The Hall sensor as defined in Claim 1, wherein:
   said first Hall-voltage value is the sum, or parallel switching value, of the respective Hall voltages of the first and second Hall cells in the first orthogonal position; and
   the second Hall-voltage value is the sum, or parallel switching value, of the respective Hall voltages of the first and second Hall cells in the second orthogonal position.

3. The Hall sensor as defined in claim 1, wherein said first and second Hall cells, said summing device, and said switching device are integrated on a common semiconductor surface.

4. The Hall sensor as defined in claim 3, further including an analog-to-digital converter that digitizes said Hall voltages from said first and second Hall cells to provide digitized values, and wherein said summing device comprises a digital adder that adds said digitized values.

5. The Hall sensor as defined in claim 3, further including an analog-to-digital converter that digitizes said first and second Hall-voltage values to provide digitized values, and wherein said summing device comprises a digital adder that adds said digitized values.

6. The Hall sensor as defined in claim 3, wherein said substrate comprises a semiconductor surface, and said Hall cells are formed in or upon said semiconductor surface as diffused or implanted regions.

7. The Hall sensor as defined in claim 3, wherein said substrate comprises a semiconductor surface, and said Hall cells are formed upon said semiconductor surface as inversion layers produced or influenced by gate electrodes.

8. The Hall sensor as defined in claim 3, wherein said substrate comprises a semiconductor surface, and wherein said Hall cells comprise thin layers deposited on said semiconductor surface by sputtering or chemical vapor deposition.

9. The Hall sensor as defined in claim 3, wherein said Hall cells are coupled to devices for supply-current injection and supply-current collection.

10. The Hall sensor as defined in claim 9, characterized in that said first and second supply currents are injected into and taken from the first and second Hall cells, respectively, through respective MOS transistors, one electrode of each MOS transistor being a resistive region of the respective Hall cell.

11. The Hall sensor as defined in claim 3, wherein said first and second Hall cells have a sheet resistivity and have an operating temperature range, said source of supply current further comprising constant-current sources that are technologically and thermally coupled with said first and second Hall cells, said constant-current sources generating temperature-independent constant currents to said switching device for feeding said first and second Hall cells as said first and second supply currents, respectively, the value of the constant currents being inversely proportional to said sheet resistivity of the Hall cells at a reference temperature in said operating temperature range.

12. The Hall sensor as defined in claim 1, further including third and fourth geometrically identical and orthogonally switchable Hall cells for offset-voltage precompensation, said third and fourth Hall cells being connected in parallel with the first and second Hall cells.

13. The Hall sensor as defined in claim 1, wherein said angle between said respective current flows is an angle other than 0° and 180°.

14. An offset-compensated Hall sensor for detecting a magnetic field, comprising:
a common substrate;
a first Hall cell formed on said common substrate, said first Hall cell having first and second pairs of terminals, said first Hall cell generating a Hall voltage between one of said pairs of terminals when a current flows between the other of said pairs of terminals;
a second Hall cell formed on said common substrate, said second Hall cell having third and fourth pairs of terminals, said second Hall cell generating a Hall voltage between one of said pairs of terminals when a current flows between the other of said pairs of terminals;
a source of first and second supply currents;
a switching device connected to said source of first and second supply currents and to said first, second, third and fourth pairs of terminals to switch said first and second supply currents from said source of supply current to said Hall cells, said switching device operating in a first state to switch said currents so that current flows in said first Hall cell in a first direction between said first pair of terminals and so that current flows in said second Hall cell between said third pair of terminals in a second direction at an angle to said first direction, said switching device operating in a second state to switch said currents so that current flows in said first Hall cell between said second pair of terminals in a third direction orthogonal to said first direction and so that current flows in said second Hall cell between said fourth pair of terminals in a fourth direction orthogonal to said second direction, said switching device outputting a first Hall-voltage value from said second and fourth pairs of terminals in said first state and outputting a second Hall-voltage value from said first and third pairs of terminals in said second state; and
a summer for summing said first and second Hall-voltage values to form an offset-compensated Hall-voltage value.

15. The offset-compensated Hall sensor as defined in claim 14, wherein said first direction and said second direction are oriented with respect to each other by an angle other than 0° and 180°.

16. The offset-compensated Hall sensor as defined in claim 14, wherein said first direction and said second direction are oriented with respect to each other by an angle of 45°.

17. The offset-compensated Hall sensor as defined in claim 14, wherein said first direction and said third direction are oriented with respect to each other by an angle of 90°.

18. The offset-compensated Hall sensor as defined in claim 14, wherein said Hall voltage generated by said first cell and said Hall voltage generated by said second cell are connected in parallel.

19. A method for compensating for offset in a Hall detector in a magnetic field, comprising the steps of:
passing first and second currents from a source of supply current through respective first and second Hall sensors in said Hall detector in respective first and second directions, said first and second currents and said magnetic field causing said first and second Hall sensors to generate first and second Hall voltages, respectively;
generating a first Hall-voltage value responsive to said first and second Hall voltages;
passing third and fourth currents from said source of supply current through said first and second Hall sensors, respectively, in third and fourth directions, respectively, said third and fourth currents and said magnetic field causing said first and second Hall sensors to generate third and fourth Hall voltages, respectively;
generating a second Hall-voltage value responsive to said third and forth Hall voltages; and
summing said first and second Hall-voltage values to generate an offset-compensated Hall-voltage.

20. The method as defined in claim 19, wherein said first direction differs from said third direction by 90°, and said second direction differs from said fourth direction by 90°.

* * * * *